United States Patent
Barash

(10) Patent No.: US 9,690,886 B1
(45) Date of Patent: Jun. 27, 2017

(54) SYSTEM AND METHOD FOR A SIMULATION OF A BLOCK STORAGE SYSTEM ON AN OBJECT STORAGE SYSTEM

(71) Applicant: ZERTO LTD., Herzliya (IL)

(72) Inventor: Gil Barash, Tel-Aviv (IL)

(73) Assignee: ZERTO LTD., Herzliya (IL)

( * ) Notice: Subject to any disclaimer, the term of this patent is extended or adjusted under 35 U.S.C. 154(b) by 0 days.

(21) Appl. No.: 15/197,812

(22) Filed: Jun. 30, 2016

(51) Int. Cl.
G06F 9/44 (2006.01)
G06F 13/10 (2006.01)
G06F 13/12 (2006.01)
G06F 17/50 (2006.01)
G06F 3/06 (2006.01)

(52) U.S. Cl.
CPC ........ G06F 17/5009 (2013.01); G06F 3/0604 (2013.01); G06F 3/0632 (2013.01); G06F 3/0673 (2013.01)

(58) Field of Classification Search
CPC .. G06F 17/5009; G06F 3/0673; G06F 3/0632; G06F 3/0604
USPC .......................................................... 703/21
See application file for complete search history.

(56) References Cited

U.S. PATENT DOCUMENTS

| | | | | |
|---|---|---|---|---|
| 7,877,357 B1* | 1/2011 | Wu | ...................... | G06F 11/1458 707/639 |
| 2003/0101186 A1* | 5/2003 | Lanzatella | ........ | G06F 17/30106 |
| 2008/0140724 A1* | 6/2008 | Flynn | ...................... | G06F 1/183 |
| 2011/0082997 A1* | 4/2011 | Yochai | .................. | G06F 3/0605 711/171 |
| 2012/0124307 A1* | 5/2012 | Ashutosh | ............ | G06F 11/1451 711/162 |
| 2014/0040286 A1* | 2/2014 | Bane | ................. | G06F 17/30253 707/754 |

* cited by examiner

Primary Examiner — Dwin M Craig
(74) Attorney, Agent, or Firm — Pearl Cohen Zedek Latzer Baratz LLP

(57) ABSTRACT

An embodiment may simulate a block storage system on an object storage system. An embodiment may define one or more logical parts of the block storage system and may store data included in the logical parts in a respective plurality of objects in the object storage system. In order to modify a simulation when data in the block storage system is modified, an embodiment may create a new object in the object storage system and may store the modified data in the new object. An embodiment may update a range-map to include at least one of: a reference to the new object, a logical address of the modified data, a size of the modified data and a counter.

20 Claims, 3 Drawing Sheets

SYSTEM AND METHOD FOR A SIMULATION OF A BLOCK STORAGE SYSTEM ON AN OBJECT STORAGE SYSTEM

FIELD OF THE INVENTION

The present invention relates generally to generating a simulation of a storage system. More specifically, the present invention relates to simulating a block storage system on an object storage system.

BACKGROUND OF THE INVENTION

Object storage (also known as object-based storage) is known in the art. Object storage techniques or object-based storage systems or architectures are available, e.g., the online storage web service S3 offered by Amazon. Object Storage techniques may use a digital data storage architecture or platform that stores and manages data as objects or containers (e.g., buckets in S3). Object Storage is simpler than other architectures (e.g., file system) and offers advantages such as scalability and low cost.

In some object-based storage system, each object has a unique, string name, and an object (or part of the content in an object) can be retrieved using the object's name. Some object-based storage systems provide a listing service that provides a user with a list of objects in the object-based storage system.

As further known in the art, in some object-based storage systems, the content of, or data included in, an object stored in an object-based storage system cannot be modified while the object is stored in the object-based storage system. Accordingly, in order to modify a content object in an object-based storage system, the object may need to be read, modified and then written back to the object-based storage system.

Block storage systems (also referred to in the art as "random access storage systems") such as disks or hard drives are known in the art. Generally, a block storage system enables accessing any location in the storage system. For example, using a numerical address (or logical address), any amount of data, in any address (or offset) in a random access storage system, e.g., a disk drive, can be written to, or read from.

Generally, in block storage systems, files are split into fixed, or evenly sized blocks of data, each block having its own address, typically, no other data (or metadata) is maintained for blocks in block storage systems. In contrast, an object-based storage system doesn't split files up into raw blocks of data. Instead, entire chunks of data are stored as objects that contain the data, metadata, and at least one unique identifier.

SUMMARY OF THE INVENTION

An embodiment may simulate a block storage system on an object storage system. An embodiment may define one or more logical parts of the block storage system and may store data included in the logical parts in a respective plurality of objects in the object storage system. In order to modify a simulation when data in the simulated block storage system is modified, an embodiment may create a new object in the object storage system and may store the modified data in the new object. An embodiment may update a map to include at least one of: a reference to the new object, a logical address of the modified data, a size of the modified data and a counter.

An embodiment may receive a request to read data, the request including an address range; examine the map to identify objects in the object storage that store data related to the address range; and respond to the request based on data stored in at least one of: the plurality of objects and the new object.

An embodiment may include a value of a running counter in names of the objects; sort a plurality of objects based on the counter value; and create the map by recording a reference to an object, a logical address of the object, a size of the object and a counter value.

An embodiment may create the map by recording at least one of: a time and date value, an identification of a user and an identification of an application.

An embodiment may determine a set of objects in the object storage system that include data included in a set of logical parts; and if the number of objects in the set is greater than a threshold value then an embodiment may initialize a storage object having a size of the set of logical parts, store, in the storage object, data read from objects in the object storage system that include data included in the set of logical parts, create a new object in the object storage system and store data read from the storage object in the new object, and update the map to include at least: a reference to the new object, a logical address of the modified data, a size of the modified data and a counter. An embodiment may delete at least some of the objects in the object storage system that include data included in the set of logical parts. A map may be an in-memory object.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings. Embodiments of the invention are illustrated by way of example and not limitation in the figures of the accompanying drawings, in which like reference numerals indicate corresponding, analogous or similar elements, and in which:

It will be appreciated that for simplicity and clarity of illustration, elements shown in the figures have not necessarily been drawn accurately or to scale. For example, the dimensions of some of the elements may be exaggerated relative to other elements for clarity, or several physical components may be included in one functional block or element. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components, modules, units and/or circuits have not been described in detail so as not to obscure the invention. Some features or elements described with respect to one embodiment may be combined with features or elements described with respect to other embodiments. For the sake of clarity, discussion of same or similar features or elements may not be repeated.

Although some embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term set when used herein may include one or more items. Unless explicitly stated, the method embodiments described herein are not constrained to a particular order or sequence. Additionally, some of the described method embodiments or elements thereof can occur or be performed simultaneously, at the same point in time, or concurrently.

Figure 1:
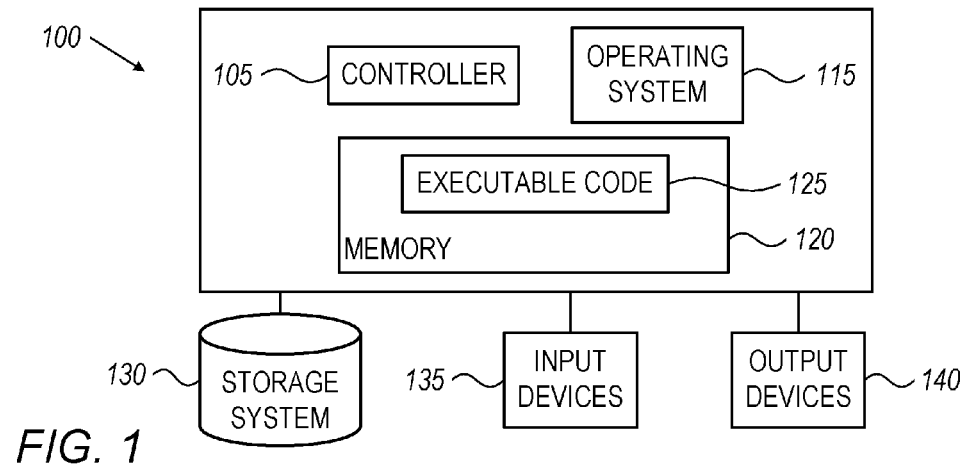
FIG. 1 shows high level block diagram of an exemplary computing device according to some embodiments of the present invention.

Reference is made to FIG. 1, showing a high level block diagram of an exemplary computing device according to some embodiments of the present invention. Computing device 100 may include a controller 105 that may be, for example, a central processing unit processor (CPU), a chip or any suitable computing or computational device, an operating system 115, a memory 120, executable code 125, a storage system 130, input devices 135 and output devices 140. Controller 105 (or one or more controllers or processors, possibly across multiple units or devices) may be configured to carry out methods described herein, and/or to execute or act as the various modules, units, etc. More than one computing device 100 may be included, and one or more computing devices 100 may act as the various components, for example the components of system 200 such as simulation unit 210 shown in FIG. 2. For example, system 200 described herein, or various components or modules of system 200, may be, or may include components of, computing device 100 (more than one such device may be included). For example, by executing executable code 125 stored in memory 120, controller 105 or more than one such controller may be configured to carry out a method of simulating block storage on an object storage system as described herein. For example, controller 105 may be configured to create objects and a range map and use the range map to create and update a simulation of the block storage system as described herein.

Operating system 115 may be or may include any code segment (e.g., one similar to executable code 125 described herein) designed and/or configured to perform tasks involving coordination, scheduling, arbitration, supervising, controlling or otherwise managing operation of computing device 100, for example, scheduling execution of software programs or enabling software programs or other modules or units to communicate. Operating system 115 may be a commercial operating system.

Memory 120 may be or may include, for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 120 may be or may include a plurality of, possibly different memory units. Memory 120 may be a computer or processor non-transitory readable medium, or a computer non-transitory storage medium, e.g., a RAM.

Executable code 125 may be any executable code, e.g., an application, a program, a process, task or script. Executable code 125 may be executed by controller 105 possibly under control of operating system 115. For example, executable code 125 may be an application that simulates block storage on an object storage system as further described herein. Although, for the sake of clarity, a single item of executable code 125 is shown in FIG. 1, a system according to some embodiments of the invention may include a plurality of executable code segments similar to executable code 125 that may be loaded into memory 120 and cause controller 105 to carry out methods described herein. For example, units or modules described herein (e.g., simulation unit 210) may be, or may include, controller 105, memory 120 and executable code 125. For example, simulation unit 210 may include at least a memory 120, define one or more logical parts of a block storage system and store data included in the logical parts in a respective plurality of objects in an object storage system; and, when data in the block storage system is modified, create a new (or additional) object in the object storage system and store, in the new or additional object the modified data. A controller such as controller 105 in simulation unit 210 may be configured to modify or update a map (e.g., a range-map described herein) to include at least one of: a reference to the new object, a logical address of the modified data, a size of the modified data and a counter.

Storage system 130 may be, or may include, either a block storage system or device or an object-based storage system or device. Storage system 130 may be or may include, for example, a hard disk drive, a floppy disk drive, a Compact Disk (CD) drive, a CD-Recordable (CD-R) drive, a Blu-ray disk (BD), a universal serial bus (USB) device or other suitable removable and/or fixed storage unit. Content may be stored in storage system 130 and may be loaded from storage system 130 into memory 120 where it may be processed by controller 105. In some embodiments, some of the components shown in FIG. 1 may be omitted. For example, memory 120 may be a non-volatile memory having the storage capacity of storage system 130. Accordingly, although shown as a separate component, storage system 130 may be embedded or included in memory 120.

Input devices 135 may be or may include a mouse, a keyboard, a touch screen or pad or any suitable input device. It will be recognized that any suitable number of input devices may be operatively connected to computing device 100 as shown by block 135. Output devices 140 may include one or more displays or monitors, speakers and/or any other suitable output devices. It will be recognized that any suitable number of output devices may be operatively connected to computing device 100 as shown by block 140. Any applicable input/output (I/O) devices may be connected to computing device 100 as shown by blocks 135 and 140. For example, a wired or wireless network interface card (NIC), a printer, a universal serial bus (USB) device or external hard drive may be included in input devices 135 and/or output devices 140.

A system according to some embodiments of the invention may include components such as, but not limited to, a plurality of central processing units (CPU) or any other suitable multi-purpose or specific processors or controllers (e.g., controllers similar to controller 105), a plurality of input units, a plurality of output units, a plurality of memory units, and a plurality of storage units. A system may additionally include other suitable hardware components and/or software components. In some embodiments, a system may include or may be, for example, a personal computer, a desktop computer, a laptop computer, a workstation, a server computer, a network device, or any other suitable computing device. For example, a system as described herein may include one or more devices such as computing device 100.

In some cases, it may be desirable to simulate, clone or replicate a block storage system in, or on, an object-based storage system, e.g., due to the low cost of storage in an object-based storage system. The term simulation as used herein may mean, or may be related to, cloning or replicating as known in the art, e.g., copying data from a first storage system to a second storage system.

When used with respect to a block storage system, the terms "simulating", "replicating", "cloning" or "copying" as referred to herein may relate to data and functionality of the block storage system. For example, simulating, replicating or cloning a block storage system by, using, or on, an object-based storage system (e.g., simulating, replicating or cloning block storage system 250 using object-based storage system 240 as described herein) may include storing or including in an object-based storage system any information such that any data or functionality provided by a simulated, replicated or cloned block storage system can be provided by the object-based storage system. For example, a simulation, replication, or cloning of a block storage system, by an object-based storage system, may provide users with data, e.g., files, and with functionality, e.g., services or execution of applications.

However, since an object in an object-based storage system cannot be modified without reading the object, modifying it and writing it back to the object-based storage system, simulating, cloning or replicating a block storage system in, or on, an object-based storage system is a challenge faced by the industry.

Figure 2:
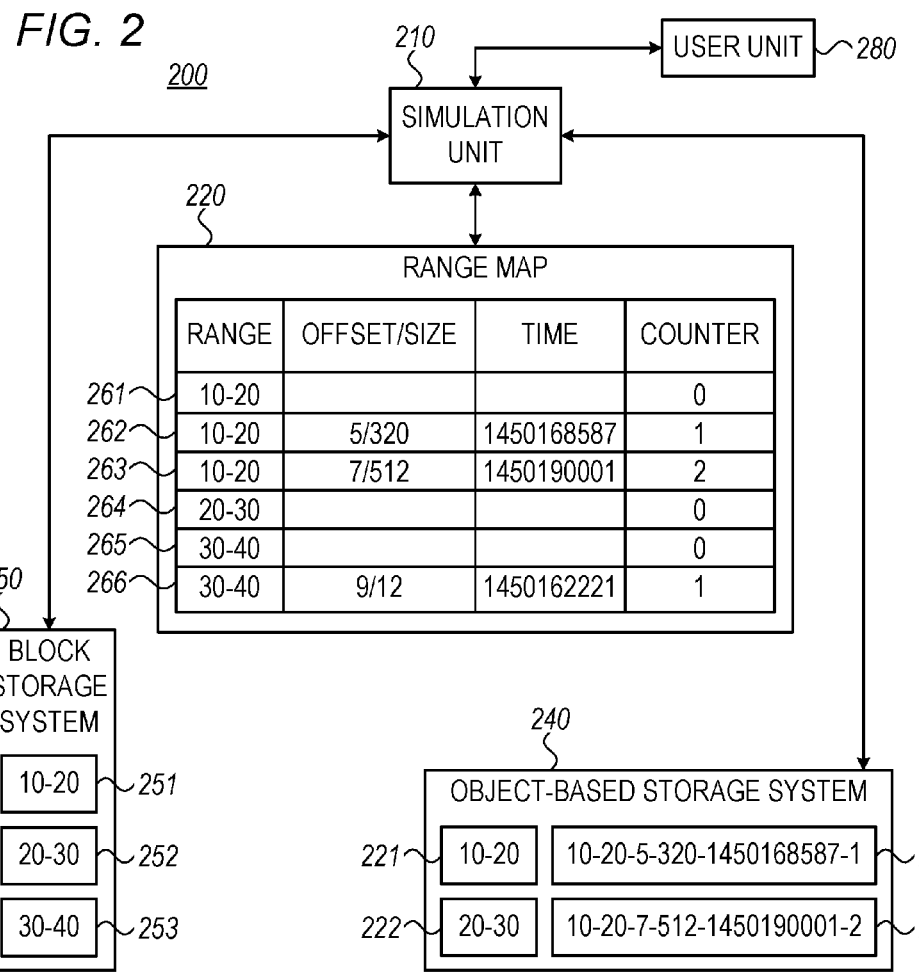
FIG. 2 is an overview of a system according to some embodiments of the present invention.

Reference is made to FIG. 2, an overview of a system 200 and flows according to some embodiments of the present invention. As shown, a system 200 may include a simulation unit 210 and a map such as a range map 220. It will be understood that any suitable map or data structure may be used in order to store, update, read or otherwise maintain and use information and data as described with respect to range-map 220. Accordingly, the terms "map", "range map" and "range-map" may be used herein interchangeably and may mean, or refer to, the same thing or entity. As shown, range map (also referred to herein as range-map) 220 may include entries or rows that include, for each entry or row, data such as a range value, an offset value, a size value, a time value and a counter. Other or different data may be used. As described, each entry may be related to an object and information in an entry may be used for determining the name of the relevant object as further described herein. An exemplary range map 220 may include rows or entries 261-266 as shown. As further shown, system 200 may include, or may be connected to, a block storage system 250 and an object-based storage system 240. Object-based storage system 240 may be a cloud-based storage system as known in the art. As shown, block storage system 250 may include, or be used in order to store, logical data blocks (LDB s) 251, 252 and 253. Object-based storage system 240 may include, or be used in order to store, objects 221, 222, 230 and 235. A user unit 280 may be connected to simulation unit 210. For example, a user or operator of user unit 280 may be a client or user of block storage system 250 (e.g., an agent or employee, or a server in an organization) and may, during a first time period, read and write data from/to block storage system 250 and/or use services provided by block storage system 250 (e.g., use a mail server or database application executed by block storage system 250). Various units, modules or component shown in FIG. 2 may be, or may include components of, computing device 100. For example, simulation unit 210 may be, or may include components of computing device 100. Similarly, user unit 280, range map 220, object storage system 240 and block storage system 250 may include elements of computing device 100. For example, range map 220 may be, or may include a memory similar to memory 120 and user unit 280, object storage system 240 and block storage system 250 may include a controller 105 and a memory 120.

During a second time period, e.g., when block storage system 250 is simulated, replicated or cloned by object-based storage system 240, user unit 280 may connect to simulation unit 210 and be provided, by simulation unit 210, with any data or functionality as provided by block storage system 250 during the first time period. For example, a server or a virtual machine (VM) included in or connected to block storage system 250 and used by user unit 280 during a first time period and the server or VM may be failed-over to object-based storage system 240, and used by user unit 280 during the second time period as known in the art. Although not shown, when using block storage system 250, user unit 280 may be connected directly to object-based storage system 240, e.g., without going through, or otherwise involving, simulation unit 210.

It is noted that in order to simulate a block storage system, an embodiment does not require an actual block storage system to be included in a system. For example, block storage system 250 need not be used and simulation unit 210 and object-based storage system 240 may simulate a block storage system without block storage system 250. While in some embodiments an existing block storage system may be migrated to, or be simulated by, an object-based storage system, in other embodiments a simulation of a block storage system using an object-based storage system may be performed from scratch, without any actual block storage system. Accordingly, it will be understood that inclusion of block storage system 250 in system 200 is optional and some configurations of system 200 do not include block storage system 250.

Simulation unit 210, block storage system 250 and object-based system 240 may be connected to a network (not shown), e.g., the internet or a private network, and may freely communicate (e.g., send and receive messages or other data) over the network, e.g., using network cards (NICs) or wireless communication systems and software (e.g., drivers) as known in the art.

Block storage system 250 may be any block storage system as known in the art and may include components of computing device 100, e.g., a memory 120, a controller 105 and a storage system 130. For example, block storage system 250 may be, or may include, a server and a redundant array of independent disks (raid) connected to the server.

Object-based storage system 240 may be any suitable object-based storage system. For example, object-based storage system 240 may be the online storage web service S3 offered by Amazon. Objects 221, 222, 230 and 235 may be any objects included in an object-based storage system, for example, objects 221, 222, 230 and 235 may be objects in the online storage web service S3 offered by Amazon. It will be understood that any method or system used as the underlying layer may be used (e.g., by a provider of object-based storage such as Amazon) in order to achieve, implement and/or provide object storage as described herein.

LDBs 251, 252 and 253 may be any data units stored in block storage system 250. An LDB may be defined, created and used based on a configuration parameter or value. For example, based on a configuration value, simulation unit 210 may define an LDB as a ten megabyte (10 MB) data block and may associate offsets (or addresses) in block storage system 250 with LDBs. An offset as referred to herein may be a distance from, or an address related to, a reference point in a storage system. For example, an offset may be calculated or determined based on the location or number of a sector in a disk. Accordingly, an offset may represent, point to, or be associated with a specific address in a storage system. For example, LDB 251 may be, or may include, data stored from offset or address 10M to (but not including) offset or address 20M in a disk. For example, LDB 251 may be, or may include, data stored in offsets or addresses 10-20, LDB 252 may be, or may include, data stored in offsets or addresses 20-30, LDB 253 may be, or may include, data stored in offsets or addresses 30-40 and so on. In some embodiments, an LDB includes, or is defined by, an offset and a size. It will be understood that any type, or size, of LDBs may be used by a system and method according to embodiments of the invention.

Simulation unit 210 may be, or may include components of, computing device 100. For example, simulation unit 210 may include a memory 120 and a controller 105. For example, simulation unit 210 may be a server operatively connected to block storage system 250 and operatively connected to object-storage system 240. In some embodiments, simulation unit may be connected only to object-based system 240. For example, after a simulation or replication of block storage system 250 has been created on object-based system 240 as described, simulation unit 210 may be disconnected from block storage system 250 and provide data and functionality of block storage system 250 using the simulation or replication on object-based system 240. Although shown as a separate component, in some embodiments, simulation unit 210 may be included in block storage system 250 or in object-storage system 240. For example, block storage system 250 and simulation unit 210 may be included in, or executed by, the same server. Range map 220 may be any suitable object adapted to include information related to LDBs in block storage system 250 and information related to objects in object-storage system 240 as further described. For example, range map 220 may be a list or table, or it may be an object in a database, e.g., a file. In some embodiments, range map 220 may be an in-memory object as known in the art, e.g., stored in a RAM or other fast memory. For example, range map 220 may be a segment of memory 120 (an in-memory as known in the art) such that controller 105 may quickly and in real-time, modify or update range map 220. Range map may be stored in storage system 130, e.g., in order to keep a copy of range map 220 across resets or reboots or a system. For example, controller 105 may load a copy of range map 220 from storage system 130 into memory 120 and use range map 220 in memory 120 as described herein. Range map 220 may be stored in a database, e.g., using persistent storage, for example, range map 220 may be included in a file created according to any format and the file may be stored in a database as known in the art.

As described, in some embodiments, simulation unit 210 splits block storage system 250 into logical parts or LDBs, e.g., starting from, for example, offset or address zero ("0") of a disk of block storage system 250, every 10 MB of data is defined by simulation unit 210 to be, or viewed by simulation unit 210 as, a logical part or an LDB. As with other examples herein, other ranges and values may be used.

Figure 3:
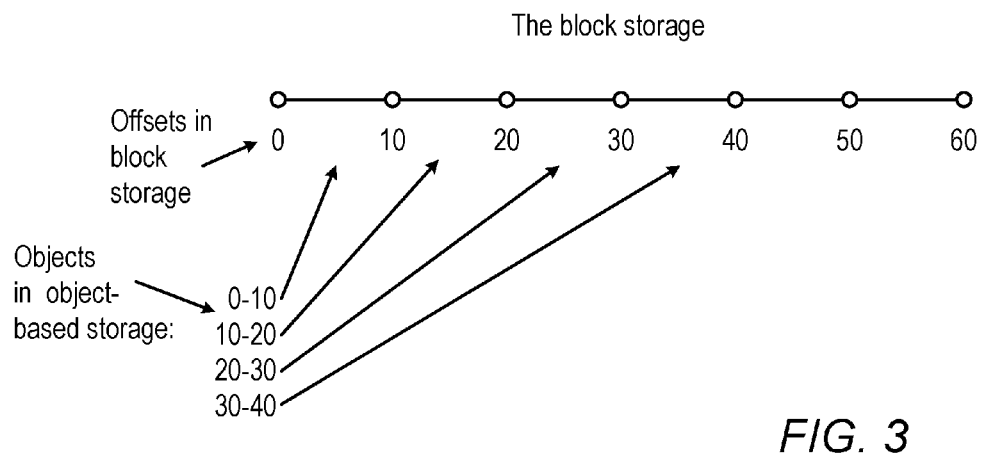
FIG. 3 graphically illustrates defining logical data blocks according to some embodiments of the present invention.

Reference is additionally made to FIG. 3 that graphically illustrates splitting or dividing a block storage system into LDBs. As shown, offsets or address ranges in a block storage system may be mapped, linked or associated with objects in an object-based storage system. For example, and as shown, object 0-10 may be linked to or associated with, the address range of 0 to 10 (e.g., 0 to 10 MB). For example, objects 0-10 in an object-based storage system may store or include data stored or included in addresses 0 to 10 MB in a block storage system. As further described herein, objects in object-storage storage (e.g., 0-10, 10-20 etc.) shown in FIG. 3 may be, or may be used in order to, simulate a block storage, e.g., the block storage with offsets 0, 10, 20 and so on as shown in FIG. 3.

In some embodiments, simulation unit 210 may read data in LDBs and copy or store the data in objects in object-based system 240. As described, when storing an object in object-based system 240 a name for the object may be provided, e.g., by simulation unit 210 to object-based system 240, and the object may subsequently be retrieved e.g., by simulation unit 210 from object-based system 240, using its name. In some embodiments, simulation unit 210 may name or label objects in object-based system 240 based on offsets, addresses, sizes and/or LDBs. For example, data or content in each LDB in block storage system 250 may be stored in an object whose name includes the offsets or address range of the LDB. For example, the name of an object in object-based system 240 that includes data included in offsets 10 MB to 20 MB in block storage system 250 may be named or labelled "10-20". For example, as shown, the range of object 221 may be "10-20" and object 221 may store data in offsets 10-20 in block storage system 250 (as shown by LDB 251). Similarly, an object in object-based system 240 that represents, or stores data in the range from the $20^{th}$ MB till the $30^{th}$ MB in block storage system 250 may be "20-30" and so on.

Simulation unit 210 may modify or update range map 220 such that an association of objects and LDBs is created and maintained. For example, and as shown, an association of object 221 and LDB 251 may be, or may be represented by, an entry in range map 220 that links object 221 to offsets 10-20.

As described herein, in some embodiments, a simulation of a block storage system may be performed without an actual, usable or real block storage system. For example, and as described, block storage system 250 need not be used or may be omitted or disconnected from system 200 and system 200 may simulate a block storage system (e.g., block storage system 250 or another block storage system) without being connected to any block storage system, e.g., using only simulation unit 210 and object-based system 240 in order to simulate a block storage system.

In some embodiments, a simulation of a block storage system using an object-based storage system may be updated, for example, periodically, continuously or in real-time, such that it is kept current or up-to-date with respect to an actual or real block storage system.

In some embodiments, a simulation of a block storage system may be changed or updated when the block storage system is changed. For example, after data included in logical blocks in block storage system 250 is stored in objects in object-based system 240 as described, when data in block storage system 250 is modified (e.g., when new data is written to block storage system 250, deleted therefrom or modified thereon), an embodiment may create an additional object in object-based system 240 and may store the modified data in the additional object. An additional object may be a new object that is added to the objects already present in object-based system 240, e.g., the additional or newly created object may be one that is created when data is modified in block storage system 250 and the additional or newly created object is used for storing the modified data. As further described herein, an embodiment may update a map (e.g., range-map 220) to include at least one of: a reference to the new or additional object, a logical address of the modified data, a size of the modified data and a running counter.

For example, a block storage system 250 may include a change detection unit (e.g., with structures such as in FIG. 1) that may detect changes in block storage system 250, for example, by intercepting write operations or by identifying changes in snapshots as known in the art. For example, a change detection unit may obtain data or content in input/output (TO) operations as, or when, they occur in block storage system 250 and provide the data to simulation unit 210. Simulation unit 210 may use data and metadata received from a change detection unit in order to update range map 220, create objects and store objects in object-based system 240 as described. Other than providing the actual data (or payload) written to block storage system 250, a change detection unit may provide simulation unit 210 with related metadata, e.g., an address, an offset and size and/or a time value. Any other system or method may be used in order to provide simulation unit 210 with data and metadata used as described herein in order to create a simulation of a block storage system on an object storage system as described.

Figure 4:
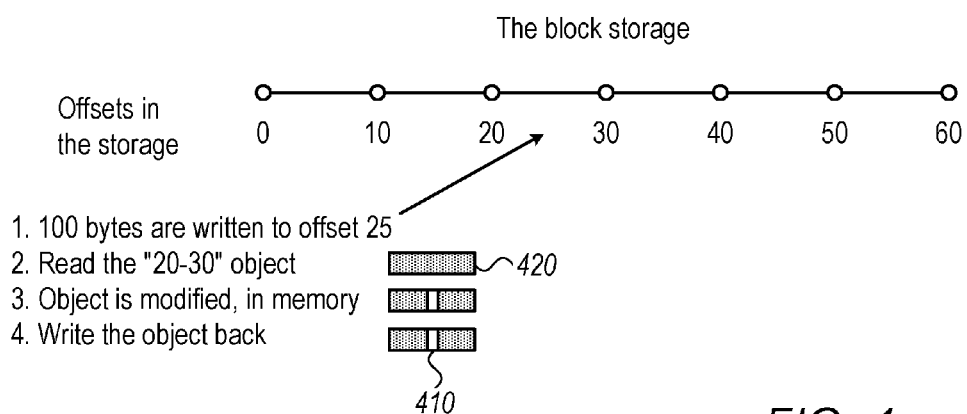
FIG. 4 graphically illustrates maintaining a simulation of a block storage system in an object-based system according to some embodiments of the invention.

Reference is additionally made to FIG. 4 that graphically illustrates maintaining a simulation of a block storage system in an object-based system according to some embodiments of the invention. In some embodiments, an object for each LDB in block storage system 250 may be created in object-based system 240 and the name of the object may be based on the at least one of: an offset of the LDB, an address of the LDB and a size of the LDB. For example, an object in object-based system 240 that includes data also included in offsets 10 to 20 in block storage system 250 may have the range of "10-20" included in its name. As described herein, the name of an object may include other information, e.g., an offset, a size, a time and a counter as described herein. Simulation unit 210 may modify or update range map 220, for example and as shown by row 261 in range map 210, an entry with the range of "10-20" may be entered into range map 220 by simulation unit 210 to indicate that an object that stores data in address range 10-20 in object-based system 240 is present, or included in, object-based system 240. As shown by rows or entries 262, 263, 264 and 265, range map 220 may include a plurality of entries for a respective plurality of objects, some of which may be related to the same address range, offset or LDB. As further described herein, objects in object-storage storage (e.g., object 420.) shown in FIG. 4 may be, or may be used in order to, simulate a block storage, e.g., the block storage with offsets 0, 10, 20 and so on as shown in FIG. 4. Accordingly, a simulation of a block storage system on, or using, an object storage system may be, or may include, a set of objects in an object storage (or object-based storage) that store data read or obtained from, or otherwise related to, a set of offsets in a block storage system.

In some embodiments, a name of an object may be set (and determined or deduced) based on a number of metadata elements (e.g., time and counter in an entry or row in range map 220). For example, based on the range, offset/size, time and counter values in entry 261, simulation unit 210 may determine that the name of the object related to, or referenced by, row 261 is simply "10-20" (e.g., since no values for other metadata elements is found in row 261) and simulation unit 210 may determine the name of the object related to, or referenced by, row 263 is "10-20-7-512-1450190001-2" (e.g., since the range is "10-20", the offset/size value is 7/512 and so on).

In other embodiments, complex names determined based on metadata may be included in range map 220. For example, simulation unit 210 may define a complex name based on metadata and enter (and use) a complex name in range map 220. For example, instead of a partial name of "10-20" in row 262, simulation unit 210 may set the name to be "10-20-5-320-1450168587-1" thus the counter value, time, size and offset values related to object 230 may be included in the name of the object as included in range map 220 and metadata related to an object may be deduced from the object's name.

In some embodiments, e.g., during an initial stage, an entry for each LDB in block storage system 250 may be created in range map 210 and an object for each LDB in block storage system 250 may be created in object-based system 240. For example, rows 261, 265 and 266 in range map 220 may be created, by simulation unit 210, when objects for (and including data in) respective offsets 10-12, 20-30 and 30-40 are created.

In order to modify a simulation (e.g., to keep the simulated system up-to-date), when data in an LDB in block storage system 250 is changed, the corresponding object in object-based system 240 may be read into a memory, modified, and the modified object may be written to object-based system 240. For example, and as shown FIG. 4, 100 bytes of data may be written to offset 25 in block storage system 250.

For example, when used in order to simulate a block storage system, simulation unit 210 may receive a write request and may use the offset written to in order to determine or identify the corresponding object. As shown by block 420, simulation unit 210 may read the corresponding object from an object-based system. As shown by block 410, simulation unit 210 may modify the object and as further shown, simulation unit 210 may write the object back to an object-based system thus keeping a simulation of a block storage system in an object-based system up-to-date.

It is noted that the embodiment described with reference to FIG. 4 may include an overhead related to having to read and write an entire object for each write of data in block storage system 250. For example, using LDBs of 10 MB and objects of the same size, even writing of a few bytes to some offset in block storage system 250 may cause an embodiment to read, from object-based system 240, an object the size of 10 MB and then write the 10 MB object to object-based system 240.

An embodiment according to embodiments of the invention may overcome the overhead of operations related to a simulation of a block storage system on an object storage system. According to some embodiments, an initial set of objects may be created as described above, e.g., such that a set of objects in an object-based system 240 include substantially the same data included in corresponding or respective set LDBs in block storage system 250.

When simulation unit 210 is notified of a write to an offset in block storage system 250 for which an object in object-based system 240 already exists, simulation unit 210 may create a new object in object-based system 240 and include the data (payload) of the write operation in the new object. Simulation unit 210 may update range map 220 to indicate that more than one write operations were made to an offset or an LDB in block storage system 250.

In some embodiments, when simulation unit 210 is notified of a write operation to an offset in block storage system 250, and is provided with data written and metadata as described, simulation unit 210 may check range map 220 and determine whether or not an object for the offset already exists. For example, based on the offset written to and an amount of data written, as reported by a change detection unit, simulation unit 210 may search range map 220 for an object that covers the, or that is related to, the write operation. For example, if a write of 100 bytes was made to offset 200 then simulation unit 210 may search range map 220 for an entry with a range that is "0-10" since an object named (or whose name includes) "0-10" may include data in the range of addresses 0 to 10 MB in block storage system 250.

If an object for the offset does not exist, simulation unit 210 may create an object as described and update range map 220 accordingly. If an object for the offset (or offsets) already exists in range map 220 then simulation unit 210 may create a new or additional object for the offset in object-based system 240 and include the payload of the write operation in the new or additional object. A name for an object may be set by simulation unit 210 based on metadata related to a write operation. For example, a name of an object may include, or be based on, the exact offset which the data was written, the length, size or amount of the data written, a time of the write operation, and a running counter.

For example, after an initial write to offset 10-20 and a creation of an object and an entry 261 as described, simulation unit 210 may receive a request to write 320 bytes of data to offset 10245 in block storage system 250 on Tuesday, 15 Dec. 2015 16:46:14 GMT. Simulation unit 210 may determine the relative offset of 10245 is 5 in the address range of 10-20. Simulation unit 210 may access, review or examine range map 220, identify or find all entries related to the LDB or address range written to, (e.g., in the present exemplary case, all entries with a range of "10-20" which are related to writing data to address range 10240 to 20480). Simulation unit 210 may identify or determine the highest counter value in all entries related to a specific LDB or address range and set the counter value for a new or additional write to the LDB or address range to be accordingly. For example, if the highest counter value found in range map 220 is 6 than simulation unit 210 may set the counter for a new write (and a new entry in range map 220) to be 7. For example, when (and before) adding entry 262, simulation unit 210 may find that the highest counter value is zero ("0") and may therefore set the counter value in entry 262 (and the range of the corresponding object 230) to be one ("1"). Similarly, when adding entry 263, the counter value may be set to two ("2").

Accordingly, simulation unit 210 may create a new or additional object as shown by object 230 and name it "10-20-5-320-1450168587-1" where the "10-20" portion of the name indicates or represents this object is related to object and offset 10-20, the "5-320" portion of the name indicates or represents that 320 bytes were written to offset 5 in the object or LDB, the "1450168587" portion of the name is a Unix time representation of the date and time as known in the art, and the "1" portion of the name is a running counter that may be advanced or incremented with each write to the offset of 10-20 in block storage system 250. At a later stage, an additional write may be made to the range of 10-20 in block storage system 250. For example, 512 bytes may be written to offset 10247 in block storage system 250 on Tuesday, 15 Dec. 2015 14:33:21 GMT.

Using the same logic as described, simulation unit 210 may create a new or additional object as shown by object 235 and name it "10-20-7-512-1450190001-2" where the "10-20" portion of the name indicates or represents this object is related to object and offset 10-20, the "7-512" portion of the name indicates or represents that 512 bytes were written to offset 7 in the object or LDB, the "1450190001" portion of the name is a Unix time representation of the date and time as known in the art, and the "2" portion of the name is a running counter that may be advanced or incremented with each write to the offset of 10-20 in block storage system 250. For example, a counter of "2" in the name indicates that two writes were made to the offset after the initial object (221) was created.

According to embodiments of the invention, when reading data from an offset or address range is required, simulation unit 210 may access, review or examine a map (e.g. range-map 220) to identify objects in the object storage that store data related to the offset or address range. For example, simulation unit 210 may receive a request to read data from an object in object-based storage system 240 and the request may include a logical address, an address range, or an offset and size. As known in the art, a logical address may be the address at which an item (e.g., a storage element such as an LDB) appears to reside from the perspective of an executing application program.

For example, in order to retrieve data using a logical address (or using other methods used with block storage systems) a unit may send a read request to simulation unit 210 and may indicate, in the request, at least one of: an offset, a size or amount of data to read and an address range, e.g., as done when requesting data from a block storage system such as a disk as known in the art.

For example, if a read request for offset 10250 is requested then simulation unit 210 may determine that the read is related to object 221 since this object covers, or is related to, addresses 10M to 20M. To find all objects related to the offset or address range, simulation unit 210 may search range map 220 for objects that include the range of object 221, e.g., include the term "10-20" in their names.

In the exemplary case illustrated by range map 220 in FIG. 2, simulation unit 210 may find entries or rows 262 and 263 that indicate additional writes to the range of 10M to 20M (or 10240 to 20480) were made. As shown, range map 220 may include additional information, e.g., the order of the additional writes (e.g., based on the counter, simulation unit 210 determines that the write represented by row or entry 263 was made after the one represented by row 262), the time a write was made, the offset written to and the size or amount of data written.

Having identified objects related to a read request, simulation unit 210 may respond to the request based on data stored the identified objects, e.g., in the above exemplary case, simulation unit 210 may respond to a read request using data in objects 221, 230 and 235 since they are all related to the same address range. For example, simulation unit 210 may read object 221 into a memory object, then according to the counter or time of write in range map 220, read object 230 and modify the memory object according to data in object 230, e.g., overwrite or modify the relevant portions of the memory object based on data in object 230, and then read object 235 and further modify the memory object according to data in object 235. Simulation unit 210 may then use the data in the modified memory object in order to generate a response to the read query and may send the response to the requesting entity. Accordingly, a response or output of an embodiment, with respect to a read request from a block storage system as described, may be, or may include, data read or obtained from, objects as described. It will be appreciated that simulating a block storage system using an object storage system as described improves the storage technology as well as a functioning of a computer. For example, a storage system may be greatly improved by embodiments of the system, e.g., storage capacity may be greatly increased while storage cost is decreased.

Some embodiments of the invention may use only some of the objects used for storing data related to an LDB or related to an address range. For example, a request for data in an address range may not cover, or be related to, the entire range. For example, a request to read 200 bytes of data from offset 10247 does not cover or require extracting all data in the address range of 10 MB to 20 NB. Simulation unit 210 may examine a request and may determine, by examining range map 220, which objects need to be retrieved in order to respond to the request. For example, in the example of requesting 200 bytes of data from offset 10247, simulation unit may determine that the last write to the requested offset is represented by object 230 (since this object covers the range of 10245 to 10565 and 200 bytes starting from 10247 are included in the range covered by object 230). Accordingly, in order to respond to a request for 200 bytes of data from offset 10247, simulation unit 210 may retrieve object 230 from object-based storage system 240 and use data in the retrieved object 230 in order to respond to the request.

In some embodiments, object-based storage system 240 may enable reading only a portion of an object stored in object-based storage system 240. For example, and as known in the art, the S3 service or platform enables reading a part of an object. Accordingly, simulation unit 210 may identify the set of objects that are relevant to a request or query and may read only a portion or part of one or more of the objects. For example, in the above example of requesting 200 bytes of data from offset 10247, simulation unit 210 may determine that the object is object 230 as described, however, instead of reading the entire object, simulation unit 210 may read (or request from object-based storage system 240) only the requested 200 bytes in object 230 (e.g., by providing an object range, offset and size as known in the art). Accordingly, a system and method according to some embodiments may be further optimized by reducing the amount of data being read from an object-based storage system.

Accordingly, some embodiments of the invention may select a set of objects to be used for generating a response based on data in a request or query (e.g., a size and address in a request) and based on data in a range map. For example, simulation unit 210 may receive a request to read data, the request including an address range and simulation unit 210 may examine range-map 220 to identify objects in object-based storage system 240 that store data related to the address range. For example, simulation unit 210 may identify or find, in range map 220, a set of one or more objects with the same range or with a name that includes a specific portion (e.g., simulation unit 210 may find in range map 220 all objects with ranges that include "10-20"). Using a set of objects found or identified as described, simulation unit 210 may retrieve at least a portion of the data in one or more of the objects and use data to generate a response for the received request.

Range map 220 may be restored or initialized based on objects in object-based storage system 240. For example, to create, initialize or restore range map 220 (e.g., following a crash or reset of a system), simulation unit 210 may examine names of objects in object-based storage system 240 and may populate entries of range map 220 based on the names. For example and as described, an object's name "10-20-7-512-1450190001-2" may be used, by simulation unit 210, to create an entry in range map 220 that indicates or shows that the object is related to range 10-20, the object was created on Tuesday, 15 Dec. 2015, the object include 512 bytes that were written to offset 7 in the range 10-20 and that this is the second write to the range after the initial object for the range was created (e.g., this object is an additional object for the range as described). In some embodiments, simulation unit 210 may sort the objects based on their names, ranges and counters to produce a sorted list and create range map 220 based on the sorted list.

In some embodiments, simulation unit 210 may merge or aggregate data in a number of objects. For example, if a large number of objects, all related to the same address range, are detected by simulation unit 210 then simulation unit 210 may create a new object (e.g., an in memory 120 object) that includes data from the objects. For example, using the counter values in object names, an in memory object may be made to first include an initial or first object related to an address range, e.g., object 221 with counter value of zero (0), then, changes may be applied to the in memory object according to the next object as indicated by the counter values, e.g., changes may be applied to the in memory object according to, or based on, content of object 230 with counter value of one (1). Similarly, further changes may be applied to the in memory object according to the next object, object 235 with counter value of one (2). In another embodiment, the order of changes applied to an in memory object may be based on the time values, that may be used in a way described herein with reference to the counter values.

An in memory object created and updated as described herein may include, or represent an up-to-date address range in block storage system 250. Accordingly, simulation unit 210 may replace a number of objects in object-based storage system 240 by one, up-to-date object. For example, after creating and updating an in memory object based on objects 221, 230 and 235, the three objects 221, 230 and 235 may be deleted or removed from object-based storage system 240, and a new or additional object that includes the content of the in memory object may be created in object-based storage system 240. For example, simulation unit 210 may write the content of the memory object to object 221, thus causing object 221 to be up-to-date and may delete objects 230 and 235 since the data in these objects is already included in the modified object 221. Accordingly, a plurality of objects may be merged or combined into a single object such that the single objects reflects an up-to-date or current state of a simulated, cloned or replicated block storage system 250. Accordingly, an embodiment may enable keeping the number of objects used in an object-based storage system 240 low.

By tracking and recording writes using range map as described, further optimizations may be enabled by embodiments of the invention. For example, in some cases, a number of writes may overlap, that is, some disk offsets written to (when writing data to a disk as known in the art) in a first write may be written (or overwritten) again in a second or subsequent write. For example, object 230 represents and includes writing of 320 bytes in offset 5 as described and object 235 represents or includes writing of 512 bytes in offset 7 as described, accordingly, the 318 bytes starting at offset 7 included in object 230 are overlapped, or re-written by, the 318 bytes starting at offset 7 included in object 235.

Some embodiments of the invention may identify the last write to an address range and/or identify the object that includes the last write or most relevant or up-to-date data and use the identified object in order to respond to a request for data. For example, if a request for 100 bytes starting at address 10250 is received by simulation unit 210 then, using range map 220, simulation unit 210 may identify or determine that the three objects 221, 230 and 235 might be relevant to the request since they are all related to an address range that includes the requested 100 bytes.

Additionally, simulation unit 210 may, e.g., using counters and/or time values and/or offsets and sizes, in range map 220 (or in the names of objects), determine that the most up-to-date, or recent, write of the requested 100 is included in object 235, e.g., using the information in range map 220 simulation unit may determine or identify that the requested 100 bytes were initially written or stored in object 221, then re-written as represented or included in object 230 and simulation unit 210 may determine that the last time the requested 100 bytes were written or updated is represented and/or included in object 235. Accordingly, simulation unit 210 may determine or identify the most relevant, recent or up-to-date object and use the identified object in order to respond to a request or query, e.g., in the above example of a request for 100 bytes starting at address 10250 (and objects and entries in range map 220 as shown in FIG. 2), simulation unit 210 may use object 235 in order to provide the requested 100 bytes starting at address 10250. As described, simulation unit 210 may read only a part of an object. For example, having determined that object 235 should be used to provide the requested 100 bytes in the above example, simulation unit 210 may identify that the size of object 235 is 512 bytes and, instead of reading the entire object 235, simulation unit 210 read only the requested 100 bytes from object 235.

Various considerations may be applied to reducing the number of objects used. For example, simulation unit 210 may keep, e.g., in a data structure such as a map, such as range map 220, data related to the data being stored. For example, a map may include or store the number of times an address range or offset was accessed, e.g., the number of times the address range 10-20 was read from and/or written to. Simulation unit 210 may update, e.g., in range map 220, an access frequency value or counter. An access frequency may indicate the number of accesses per time unit, e.g., an access frequency value of address range 10-20 may be incremented each time one of objects 220, 230 and 235 is either read, or written to, since these objects are all related to address range 10-20. If an access frequency of an address range exceeds a threshold, then simulation unit 210 may merge or aggregate some or even all of the objects related to the address range into a single object as described. For example, objects 221, 230 and 235 may be merged into object 221 and objects 230 and 235 may then be deleted or removed from object-based storage system 240, thus saving storage space and other computational resources.

Figure 5:
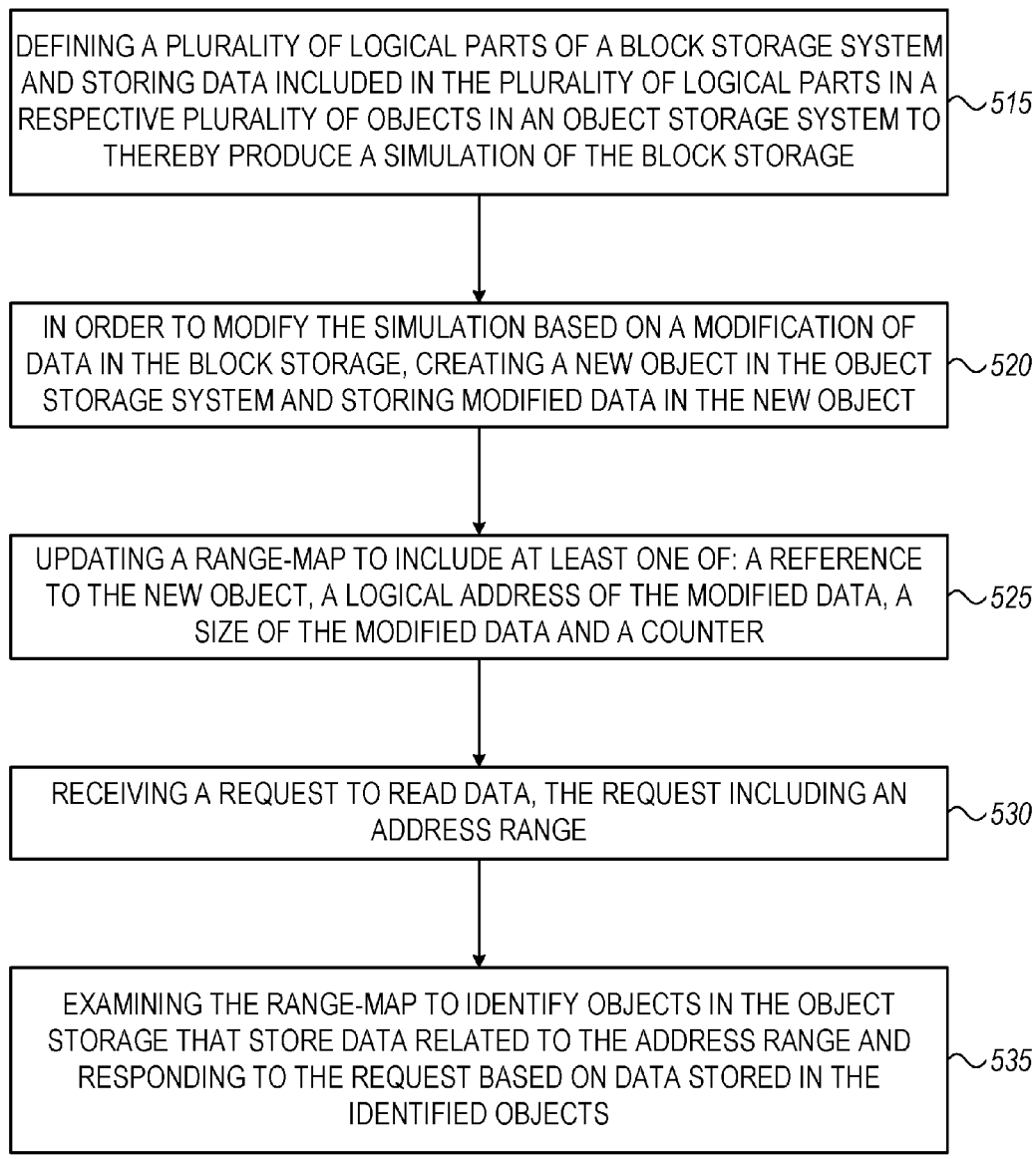
FIG. 5 shows a flowchart of a method for simulation a block storage system on an object storage system according to some embodiments of the invention.

Reference is made to FIG. 5 which shows a flowchart of a method for simulation a block storage system on an object storage system according to some embodiments of the invention. As shown by block 515, one or more logical parts or LDBs of, or in, a block storage system may be defined (e.g., in order to create a simulation of the block storage system), and data included in the logical parts or LDBs may be included in a respective one or more objects in an object storage system. For example, data logical parts or LDBs may be address ranges as described herein, e.g., address ranges 10-20 20-30 may be logical parts or LDBs of, or in, block storage system 250 and the data in address range may be included in objects 0.221, 230 and 235. For example, an embodiment may logically divide block storage system 250 into a set of logical parts such as LDBs 251, 252 and 253 and store data included in the logical parts in a respective set of objects in object-based storage system 240, e.g., objects 230 and 235.

As shown by block 520, when data in the simulated block storage system is modified, a new or additional object in the object storage system may be created and made to store the modified data. For example, when data in the range 10-20 is modified, the modified data may be included in a new or additional object, e.g., in object 230 which is a new or an additional object, with respect to object 221.

As shown by block 525, a map such as a range-map may be updated or modified. For example, a map may be updated to include at least one of: a reference to the new or additional object that includes or stores the modified data, an address of the modified data, a size of the modified data and a counter. For example, an entry in range map 220 that includes a reference to the new or additional object may be created (or updated), e.g., entry 261 is a reference to object 221, entry or row 262 is a reference to object 230 and so on. An entry in range map 220 that includes an address may be created (or updated), for example, an address range (e.g., "10-20" in the names of objects) and an offset (e.g., 5 in entry 262). For example, addresses 10250, 10240 and 204800 may be logical addresses in a disk as known in the art. A size of the modified data and a counter may be as described herein with reference to entries of range map 220.

As shown by block 530, a request to read data, including an address range, may be received, e.g., from user unit 280. For example, block storage system 250 may be simulated by object-based system 240 and simulation unit 210 and an operator (or user) of user unit 280 may send a read request to simulation unit 210 as described. In another case, e.g., when used as a backup or fail-over system, simulation unit 210 may receive requests from a server.

As shown by block 535, range-map 220 may be accessed or examined (e.g., by simulation unit 210 as described) to identify objects in the object storage that store data related to the address range and a response to a read request may be generated based on the identified objects. For example, when receiving a request related to address range 10-20, simulation unit 210 may identify that objects 221, 230 and 235 are related to the address range (e.g., based on their names as described) and may generate a response to a read request based on these objects, e.g., by updating an in memory object according to a counter or a chronological order of objects as described.

As described herein, a method or flow may include inserting or including a value of a running counter in names of the objects, sorting the objects based on the counter value, and creating a range-map by recording, in entries of the range map, references to objects, a logical addresses related to the object, sizes of the objects and counter values of the objects. For example, range map 220 includes references, logical addresses, sizes and counter values for objects 221, 222 and 230 as described.

As described herein, a method or flow may include creating a map such as a range-map based on, or by recording in the rang map, at least one of, a reference to an object, a time and date value, a running counter, an address range, an offset in the address range and a size. It will be understood that other data may be included in range map 220. For example, based on metadata included in a request to modify or write data (e.g., received from user unit 280), an identification of a user and/or an identification of an application that access data may be recorded, by simulation unit 210, in range map 220. Accordingly, merging of objects as described may be based on a user or application. For example, in order to improve performance of a specific application that reads a specific address range, simulation unit 210 may select to merge a number of objects related to the specific address range. In other cases, the access frequency threshold used for merging objects, as described, may be set differently for different users or applications.

As described, a system and method according to embodiments of the invention may include determining or finding the set of objects in an object storage system that include data included in a set of logical parts and, if the number of objects in the set is greater than a threshold value, an embodiment may initialize a storage object having a size of the set of logical parts, store, in the storage object, data read from objects in the object storage system that include data included in the set of logical parts, create a new object in the object storage system and store data read from the storage objects in the new object.

For example, simulation unit 210 may determine the set of objects 221, 230 and 235 include data included in address range or LDB 10-20 as described, and, if a threshold of two (2) is configured or set, simulation unit 210 may determine the number of objects in the set (e.g., three in this case) is greater than the threshold, may create a new object (e.g., an in memory object as described), include data from objects 221, 230 and 235 in the new object and use the new object to create a new object in object-based storage system 240 or overwrite an existing object in object-based storage system 240. As described, objects no longer needed may be deleted. For example, objects 230 and 235 may be deleted after copying data from these objects into an updated object as described.

As described, simulation unit 210 may determine the set of objects that include data included in a set of logical parts. For example, simulation unit 210 may identify or determine (e.g., based on data in rang map 220) all objects related to the set of logical parts 10-20 and 20-30. In such exemplary case, e.g., as shown in FIG. 2, simulation unit 210 may identify or determine that the set of objects 221, 222, 230 and 235 include data included in a set of logical parts 10-20 and 20-30. Simulation unit 210 may aggregate, merge or combine objects 221, 222, 230 and 235 into a new or additional object and store the new or additional object in object based storage system 240 as described. Of course, in some cases, objects may be combined or merged for a single, or just one, logical part, e.g., as described herein.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and some embodiments not specifically described may include various features described herein.

The invention claimed is:

1. A computerized method of simulating a block storage system on an object storage system, the method comprising:
    creating a simulated block storage system on the object storage system, by defining a plurality of logical parts of the simulated block storage system and storing data included in the logical parts in a respective plurality of objects in the object storage system, wherein data included in a logical part is stored in at least one respective object; and
    when receiving a notification of a write operation in the simulated block storage system:
        creating a new object in the object storage system and storing the data of the write operation in the new object, and
        updating a range-map to include at least one of: a reference to the new object, a logical address of the data of the write operation, and a size of the data of the write operation, and a counter.

2. The method of claim 1, comprising:
    receiving a request to read data, the request including an address range;
    examining the range-map to identify objects in the object storage that store data related to the address range; and
    responding to the request based on data stored in at least one of: the plurality of objects and the new object.

3. The method of claim 1, comprising:
    including a value of a running counter in names of the objects;
    sorting a plurality of objects based on the counter value; and
    creating the range-map by recording a reference to an object, a logical address of the object, a size of the object and a counter value.

4. The method of claim 3, comprising creating the range-map by recording at least one of: a time and date value, an identification of a user and an identification of an application.

5. The method of claim 1, comprising:
    determining the set of objects in the object storage system that include data included in a set of logical parts; and
    if the number of objects in the set is greater than a threshold value then:
        initializing a storage object having a size of the set of logical parts,
        storing, in the storage object, data read from objects in the object storage system that include data included in the set of logical parts, creating a new object in the object storage system and storing data read from the storage object in the new object, and updating the range-map to include at least: a reference to the new object, a logical address of the modified data, a size of the modified data and a counter.

6. The method of claim 5, comprising deleting at least some of the objects in the object storage system that include data included in the set of logical parts.

7. The method of claim 5, wherein the set of logical parts includes one logical part.

8. The method of claim 1, wherein the range-map is an in-memory object.

9. The method of claim 5, comprising removing the set of objects from the object storage system.

10. A computerized method of simulating a block storage system on an object storage system, the method comprising:

logically dividing the simulated block storage system into a set of logical parts and storing data included in the logical parts in a respective set of objects in the object storage system, wherein data included in a logical part is stored in at least one respective object; and when a write operation is performed in the simulated block storage system:

creating a new object in the object storage system and including the data of the write operation in the new object, and modifying a map to include at least one of: a reference to the object, a logical address of the data of the write operation, a size of the data of the write operation, and a running counter.

11. A system comprising:
a memory; and
a controller configured to:

define a plurality of logical parts of a simulated block storage system and store data included in the logical parts in a respective plurality of objects in an object storage system, wherein data included in a logical part is stored in at least one respective object; and when receiving a notification of a write operation in the simulated block storage system:

create a new object in the object storage system and store the data of the write operation in the new object, and update a range-map to include at least one of: a reference to the new object, a logical address of the data of the write operation, a size of the data of the write operation and a counter.

12. The system of claim 11, wherein the controller is configured to:

receive a request to read data, the request including an address range;

examine the range-map to identify objects in the object storage that store data related to the address range; and respond to the request based on data stored in at least one of: the plurality of objects and the new object.

13. The system of claim 11, wherein the controller is configured to:

include a value of a running counter in names of the objects;

sort a plurality of objects based on the counter value; and create the range-map by recording a reference to an object, a logical address of the object, a size of the object and a counter value.

14. The system of claim 13, wherein the controller is configured to create the range-map by recording at least one of: a time and date value, an identification of a user and an identification of an application.

15. The system of claim 11, wherein the controller is configured to:

determine the set of objects in the object storage system that include data included in a set of logical parts; and if the number of objects in the set is greater than a threshold value then:

initialize a storage object having a size of the set of logical parts, store, in the storage object, data read from objects in the object storage system that include data included in the set of logical parts, create a new object in the object storage system and storing data read from the storage object in the new object, and update the range-map to include at least: a reference to the new object, a logical address of the modified data, a size of the modified data and a counter.

16. The system of claim 15, wherein the controller is configured to delete at least some of the objects in the object storage system that include data included in the set of logical parts.

17. The system of claim 15, wherein the set of logical parts includes one logical part.

18. The system of claim 11, wherein the range-map is an in-memory object.

19. The system of claim 15, wherein the controller is configured to remove the set of objects from the object storage system.

20. The system of claim 11, wherein the controller is configured to create the range-map based on names of objects in object storage system.

* * * * *